United States Patent
Wu

(10) Patent No.: US 7,441,593 B2
(45) Date of Patent: Oct. 28, 2008

(54) PROTECTIVE COVER FOR HEAT-CONDUCTIVE MATERIAL OF HEAT SINK

(75) Inventor: Chung Wu, Taipei (TW)

(73) Assignee: Chaun-Choung Technology Corp., Taipei (TW)

( * ) Notice: Subject to any disclaimer, the term of this patent is extended or adjusted under 35 U.S.C. 154(b) by 680 days.

(21) Appl. No.: 11/106,513

(22) Filed: Apr. 15, 2005

(65) Prior Publication Data

US 2006/0232936 A1    Oct. 19, 2006

(51) Int. Cl.
*H05K 7/20*    (2006.01)

(52) U.S. Cl. .................. 165/185; 361/705
(58) Field of Classification Search ............. None
See application file for complete search history.

(56) References Cited

U.S. PATENT DOCUMENTS

| | | | |
|---|---|---|---|
| 3,187,964 A * | 6/1965 | Foster | 222/480 |
| 4,698,459 A * | 10/1987 | Drake | 174/138 F |
| 5,240,132 A * | 8/1993 | Tucker | 220/212 |
| 5,346,407 A * | 9/1994 | Hood | 439/522 |
| 5,439,759 A * | 8/1995 | Lippert et al. | 429/65 |
| 5,902,695 A * | 5/1999 | Siedlik et al. | 429/65 |
| 6,029,740 A * | 2/2000 | Lee et al. | 165/76 |
| 6,049,458 A * | 4/2000 | Lee et al. | 361/705 |
| 6,935,420 B1 * | 8/2005 | Dong et al. | 165/185 |
| 7,051,790 B2 * | 5/2006 | Lin | 165/80.2 |
| 7,063,136 B2 * | 6/2006 | Yu et al. | 165/185 |
| 7,068,514 B2 * | 6/2006 | Chang et al. | 361/705 |
| 2003/0150770 A1 * | 8/2003 | Campbell et al. | 206/722 |
| 2004/0252461 A1 * | 12/2004 | Wu | 361/704 |

FOREIGN PATENT DOCUMENTS

TW    358565    5/1999

\* cited by examiner

*Primary Examiner*—Allen J Flanigan

(57) ABSTRACT

A protective cover for protecting heat-conductive material of a heat sink includes a first plate with an opening to enclose the heat-conductive material and a second plate foldable to the first plate. Such that the heat-conductive material can be precisely protected by the protective cover to be isolated from contamination but with good air-circulation.

15 Claims, 5 Drawing Sheets

PROTECTIVE COVER FOR HEAT-CONDUCTIVE MATERIAL OF HEAT SINK

BACKGROUND OF THE INVENTION

The present invention relates in general to a protective cover for heat-conductive material of a heat sink, and more particularly, to a protective cover for precisely enclosing the heat-conductive material to be isolated from contamination but with good air-circulation.

Taiwan patent publication no. 358565 discloses a protective cover installed on a heat sink to enclose the heat-conductive material for protection. The protective cover includes a hat-like lid with a crown portion to cover on the heat-conductive material and a brim portion extending around the crown to be fixed on the heat sink so that the heat-conductive material can be securely protected.

However, it is inconvenient to install this kind of protective cover because it is invisible to locate the heat-conductive material precisely within the crown portion. Therefore, it may happen that the protective cover sits on the heat-conductive material. Besides, the heat-conductive material is closely covered by the above-mentioned conventional protective cover. High temperature may deteriorate the heat-conductive material when multiple heat sinks with heat-conductive material are packed for shipping.

BRIEF SUMMARY OF THE INVENTION

The present invention is to provide a protective cover including a first plate enclosing the heat-conductive material of the heat sink and a second plate foldable to the first plate. Such that the heat-conductive material can be precisely protected by the protective cover to be isolated from contamination but with good air-circulation.

Accordingly, the protective cover for protecting heat-conductive material of a heat sink provided by the present invention includes a plate, a first connecting part and a second connecting part. The plate has an opening to enclose the heat-conductive material therein. The first connecting part is formed on two sides of the opening. The second connecting part correspondingly engagable to the first connecting part is formed on the plate.

In another aspect, the protective cover for protecting heat-conductive material of a heat sink provided by the present invention includes a first plate and a second plate. The first plate has an opening to enclose the heat-conductive material therein and a first connecting part. The second plate is foldable to the first plate, having a second connecting part correspondingly engagable to the first connecting part. Thereby, after the first and the second connecting parts are engaged to each other, the second plate is covered on the first plate with a gap formed therebetween for air circulating the heat-conductive material.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These as well as other features of the present invention will become more apparent upon reference to the drawings therein.

DETAILED DESCRIPTION OF THE INVENTION

Figure 1:
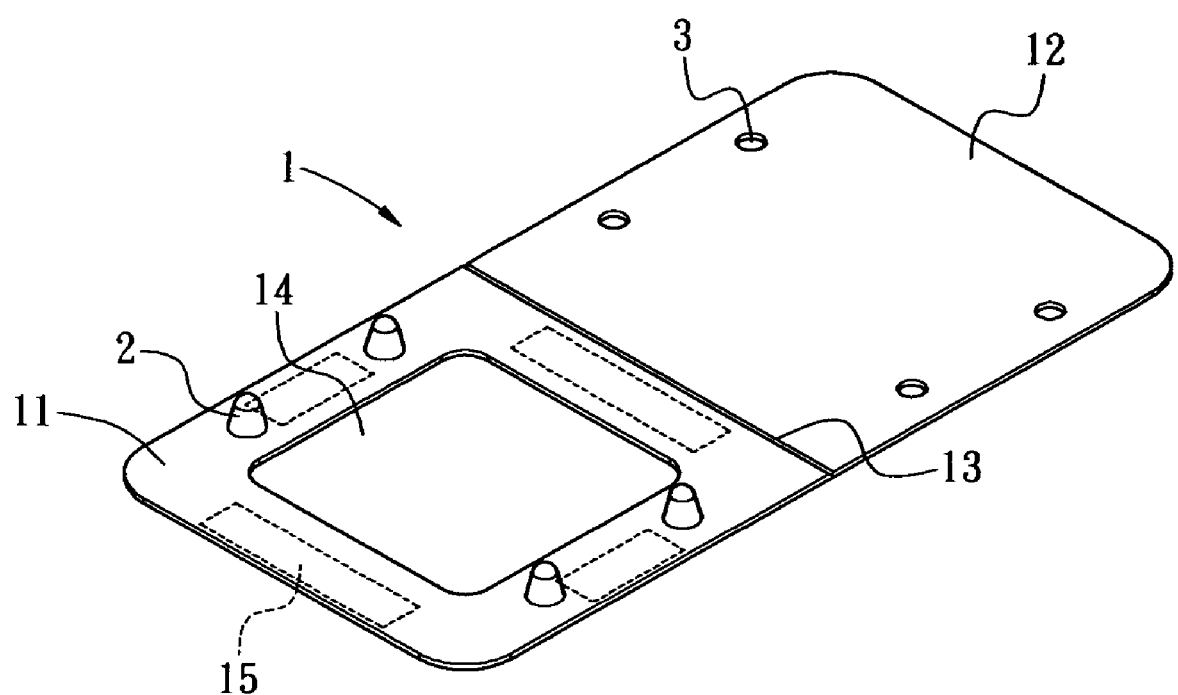
FIG. 1 is a perspective view of a protective cover according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Referring to FIG. 1, the protective cover of the present invention includes a flat plate 1, at least one first connecting part 2 and at least one second connecting part 3. The heat-conductive material of a heat sink can be precisely protected by the protective cover to be isolated from contamination but with good air-circulation.

The flat plate 1 includes a first plate 11, a second plate 12 and a folding portion 13 between the first and the second plates 11 and 12. The first plate 11 has an opening 14 preferably formed at center and an adhering component 15, such as a two-faced adhesive tape or adhesive glue, preferably formed on the edge of the bottom surface.

The first connecting part 2 is formed on the first plate 11, preferably more than two arranged on two sides of the opening 14, respectively. The first connecting part 2 is a tapered pillar with a cross section chosen from a circular, a rectangular, a triangle or a trapezoid shape.

The second connecting part 3 is preferably a hole formed on the second plate 13. The second connecting part 3 can be a circular, a rectangular, a triangle or a trapezoid hole located at a position with respect to the first connecting part 2 so that when the second plate 11 is folded along the folding portion 13 to the first plate 11, the second connecting part 3 can be securely engaged with the first connecting part 2.

Figure 2:
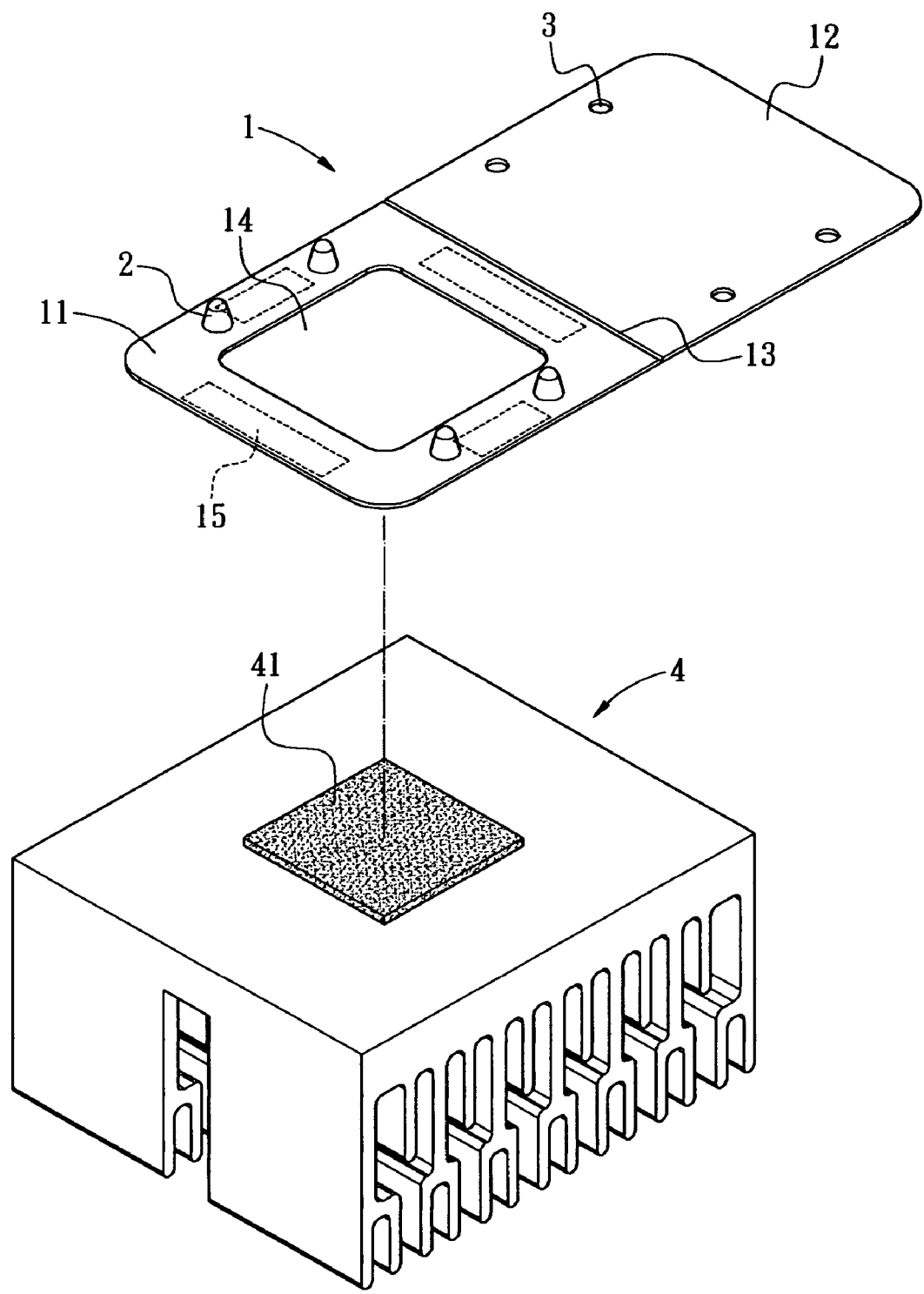
FIG. 2 is a perspective view of a protective cover installing to a heat sink.
Figure 3:
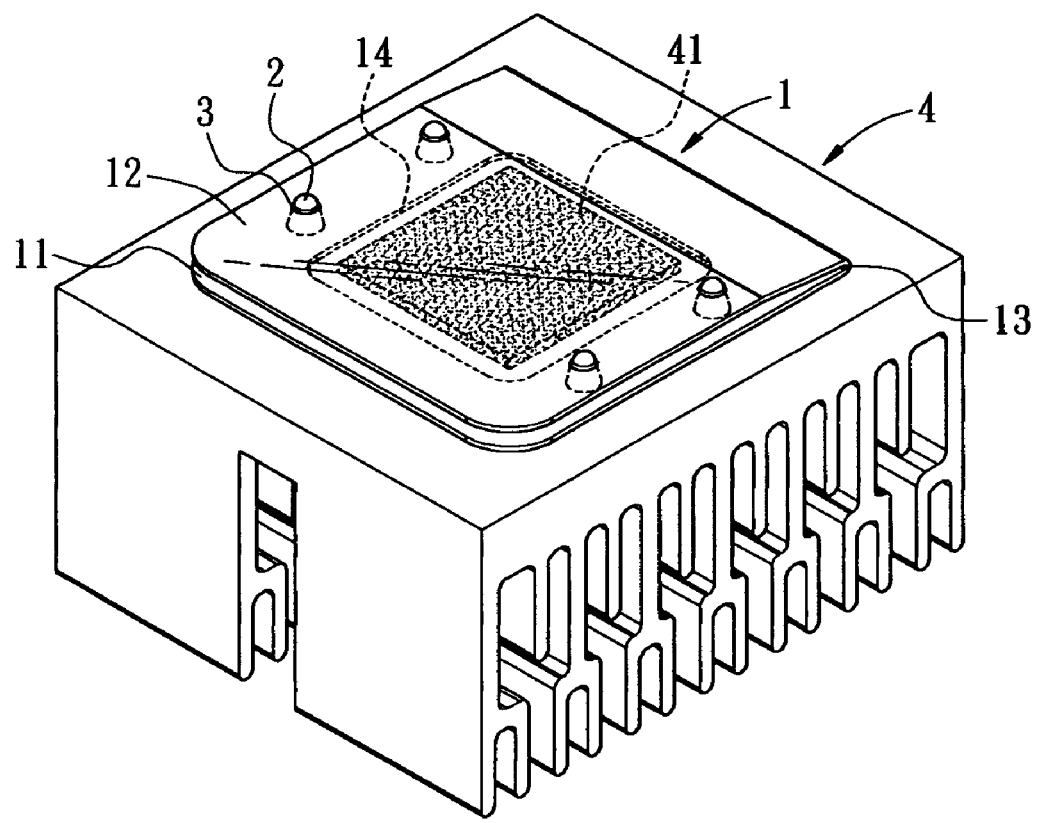
FIG. 3 is a perspective view of a protective cover mounted on a heat sink.
Figure 4:
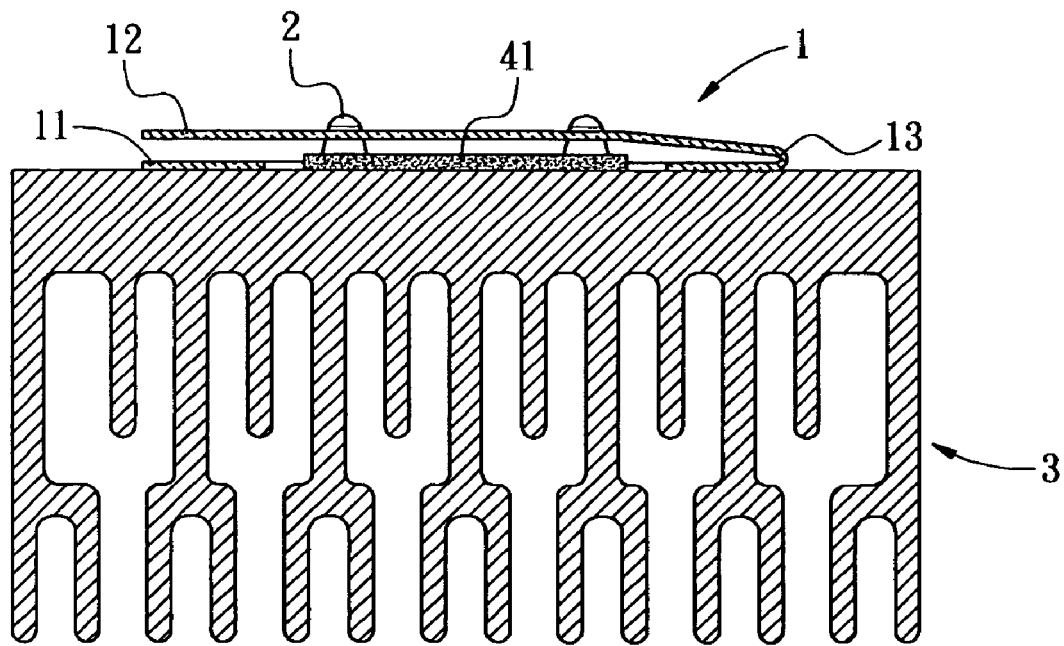
FIG. 4 is a cross-sectional view of a protective cover mounted on a heat sink.

Referring to FIG. 2 through FIG. 4 which show the installation of the protective cover of one preferred embodiment of the present invention are illustrated. First, the first plate 11 is disposed above a surface having the heat-conductive material 41 of a heat sink 4. Through the opening 14 of the first plate 11, it is convenient to locate the first plate 11 fixedly attached on the heat sink 4 by the adhering component 15 and to precisely enclose the heat-conductive material 41 within the opening 14. The thickness of the first plate 11 is not smaller than that of the heat-conductive material 41. Therefore, when the second plate 12 is folded along the folding portion 13 to the first plate 11, the second plate 12 will not touch on the heat-conductive material 41, and the heat-conductive material 41 can be securely protected between the first and the second plates 11 and 12. Moreover, the size of the hole of the second connecting part 3 is smaller than the largest perimeter at root of the pillar of the first connecting part 2. Therefore, after the first and the second connecting parts 2 and 3 are engaged to each other, there is a gap between the first and the second plate 11 and 12 for air circulating the heat-conductive material 41.

Figure 5:
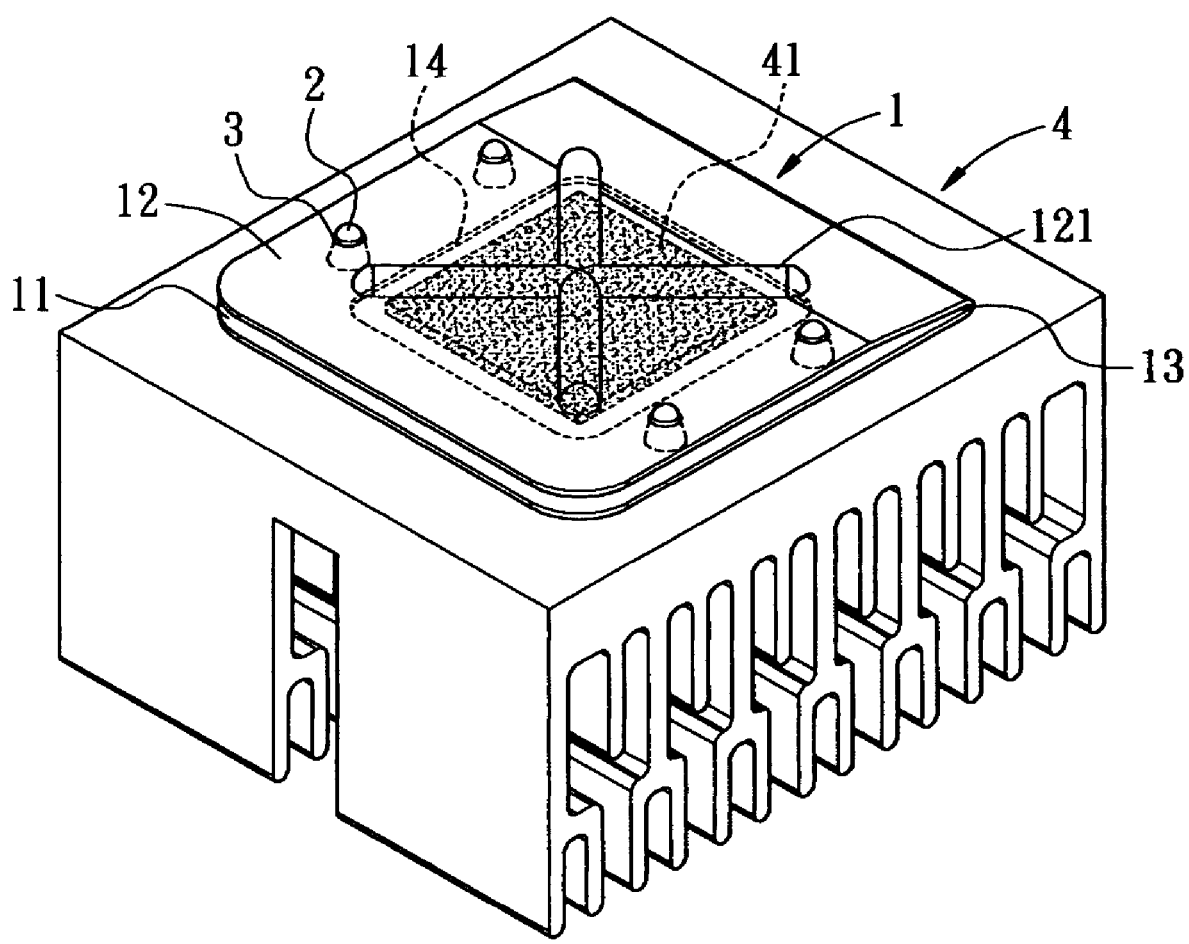
FIG. 5 is a cross-sectional view of a protective cover mounted on the heat sink according to another embodiment of present invention.

Referring to FIG. 5, another preferred embodiment of a protective cover is shown. A rib portion 121 is formed on the second plate 12 to strengthen the second plate 12 from deformation by pressing or impacting to further protect the heat-conductive material 41.

Figure 6:
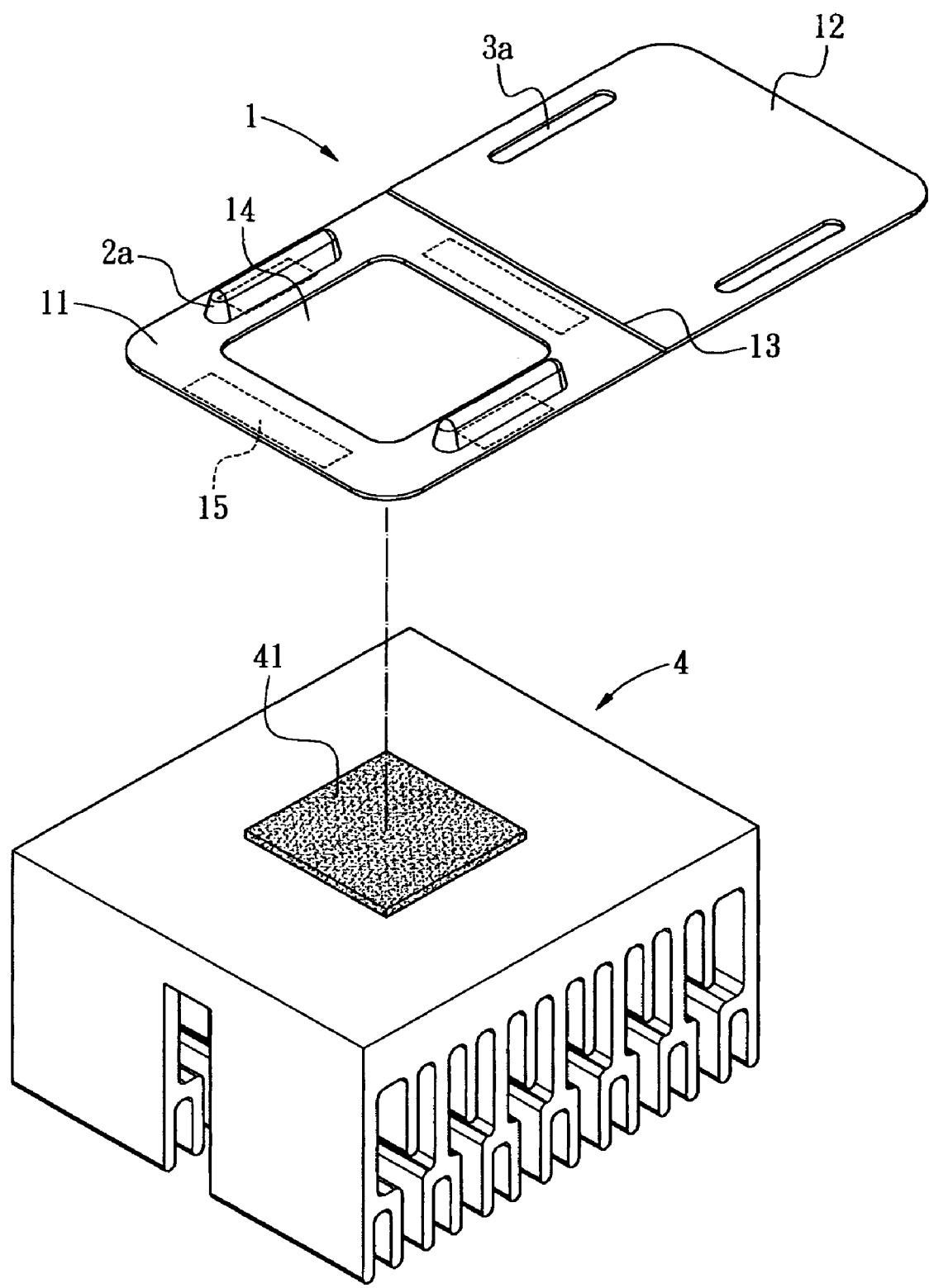
FIG. 6 a perspective view a protective cover installing to a heat sink according to another embodiment of present invention.

Referring to FIG. 6 of still another preferred embodiment of a protective cover, a first connecting part 2*a* is in form of a saddle ridge and a second connecting part 3*a* is a corresponding slot hole with a size smaller than the base size of the saddle ridge of the first connecting part 2*a*. Therefore, the engagement of the first and the second connecting parts 2*a* and 3*a* can provide the same effect of air-circulating gap between the first and the second plate 11 and 12.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A protective cover for protecting heat-conductive material of a heat sink, the protective cover comprising:
    a plate having an opening to enclose the heat-conductive material therein;
    a first connecting part formed on two sides of the opening; and
    a second connecting part correspondingly engagable to the first connecting part formed on the plate,
    wherein the plate includes a folding portion to define a first plate with the first connecting part and a second plate with second connecting part, and
    wherein the first plate has an adhering component on a bottom surface thereof for attaching to the heat sink.

2. The protective cover of claim 1, further comprising a rib portion formed on the first or the second plate.

3. A protective cover for protecting heat-conductive material of a heat sink, the protective cover comprising:
    a plate having an opening to enclose the heat-conductive material therein;
    a first connecting part formed on two sides of the opening; and
    a second connecting part correspondingly engagable to the first connecting part formed on the plate,
    wherein the plate includes a folding portion to define a first plate with the first connecting part and a second plate with second connecting part, and
    wherein the first connecting part is a tapered pillar.

4. The protective cover of claim 3, wherein the tapered pillar of the first connecting part has a cross section chosen from a circular, a rectangular, a triangle or a trapezoid shape.

5. The protective cover of claim 4, wherein the second connecting part is a circular, a rectangular, a triangle or a trapezoid hole, respectively.

6. The protective cover of claim 5, wherein the hole of the second connecting part has a size smaller than a largest perimeter of the pillar of the first connecting part.

7. The protective cover of claim 3, wherein the first connecting part is a saddle ridge.

8. The protective cover of claim 7, wherein the second connecting part is a slot hole corresponding the saddle ridge of the first connecting part.

9. A protective cover for protecting heat-conductive material of a heat sink, the protective cover comprising:
    a first plate having an opening to enclose the heat-conductive material therein and a first connecting part; and
    a second plate foldable to the first plate, having a second connecting part correspondingly engagable to the first connecting part,
    whereby after the first and the second connecting parts are engaged to each other, the second plate is covered on the first plate with a gap formed therebetween for air circulating the heat-conductive material,
    wherein the first plate has an adhering component on a bottom surface thereof for attaching to the heat sink.

10. The protective cover of claim 9, further comprising a rib portion formed on the first or the second plate.

11. A protective cover for protecting heat-conductive material of a heat sink, the protective cover comprising:
    a first plate having an opening to enclose the heat-conductive material therein and a first connecting part; and
    a second plate foldable to the first plate, having a second connecting part correspondingly engagable to the first connecting part,
    whereby after the first and the second connecting parts are engaged to each other, the second plate is covered on the first plate with a gap formed therebetween for air circulating the heat-conductive material,
    wherein the first connecting part is a tapered pillar, and
    wherein the tapered pillar of the first connecting part has a cross section chosen from a circular, a rectangular, a triangle or a trapezoid shape.

12. The protective cover of claim 11, wherein the second connecting part can is a circular, a rectangular, a triangle or a trapezoid hole, respectively.

13. The protective cover of claim 12, wherein the hole of the second connecting part has a size smaller than a largest perimeter of the pillar of the first connecting part.

14. The protective cover of claim 9, wherein the first connecting part is a saddle ridge.

15. The protective cover of claim 9, wherein the second connecting part is a slot hole corresponding the saddle ridge of the first connecting part.

* * * * *